United States Patent
Pellizzer et al.

(10) Patent No.: US 7,446,011 B2
(45) Date of Patent: Nov. 4, 2008

(54) ARRAY OF CELLS INCLUDING A SELECTION BIPOLAR TRANSISTOR AND FABRICATION METHOD THEREOF

(76) Inventors: Fabio Pellizzer, Via Peroz, 12, Follina (IT) 31051; Giulio Casagrande, Via Pietro Sala, 11, Vignate (IT) 20060; Roberto Bez, Via Vespri Siciliani, 2, Milan (IT) 20146

(*) Notice: Subject to any disclaimer, the term of this patent is extended or adjusted under 35 U.S.C. 154(b) by 194 days.

(21) Appl. No.: 11/551,170

(22) Filed: Oct. 19, 2006

(65) Prior Publication Data

US 2007/0099347 A1  May 3, 2007

Related U.S. Application Data

(62) Division of application No. 10/680,727, filed on Oct. 7, 2003, now Pat. No. 7,135,756.

(30) Foreign Application Priority Data

Oct. 8, 2002  (EP)  .................................. 02425605

(51) Int. Cl.
*H01L 21/8222* (2006.01)
(52) U.S. Cl. ........................ 438/329; 438/330
(58) Field of Classification Search ................ 438/205, 438/313, 309, 330, 322, 323
See application file for complete search history.

(56) References Cited

U.S. PATENT DOCUMENTS

| | | |
|---|---|---|
| 4,180,866 A | 12/1979 | Shanks |
| 4,981,807 A | 1/1991 | Jambotkar |
| 5,262,670 A | 11/1993 | Lee et al. |
| 5,276,638 A | 1/1994 | Wong |
| 5,789,758 A | 8/1998 | Reinberg et al. |
| 6,403,436 B1 | 6/2002 | Tanomura |
| 6,434,041 B2 | 8/2002 | Forbes |
| 6,437,383 B1 | 8/2002 | Xu |
| 6,531,373 B2 | 3/2003 | Gill et al. |
| 6,573,586 B2 | 6/2003 | Sakata et al. |
| 6,649,928 B2 | 11/2003 | Dennison |
| 6,989,580 B2 | 1/2006 | Pellizzer et al. |
| 2002/0079483 A1 | 6/2002 | Dennison |
| 2004/0041236 A1 | 3/2004 | Forbes |

*Primary Examiner*—Roy K Potter
(74) *Attorney, Agent, or Firm*—Blakely, Sokoloff, Taylor & Zafman LLP

(57) ABSTRACT

A cell array is formed by a plurality of cells each including a selection bipolar transistor and a storage component. The cell array is formed in a body including a common collector region of P type; a plurality of base regions of N type, overlying the common collector region; a plurality of emitter regions of P type formed in the base regions; and a plurality of base contact regions of N type and a higher doping level than the base regions, formed in the base regions, wherein each base region is shared by at least two adjacent bipolar transistors.

26 Claims, 4 Drawing Sheets

ARRAY OF CELLS INCLUDING A SELECTION BIPOLAR TRANSISTOR AND FABRICATION METHOD THEREOF

BACKGROUND OF THE INVENTION

1. Field of the Invention

The present invention relates to an array of cells including a selection bipolar transistor and a fabrication method thereof. In particular, the invention refers to a cell array of a phase change memory (PCM) device, without being limited thereto.

2. Description of the Related Art

As is known, phase change memory cells utilize a class of materials that have the unique property of being reversibly switchable from one phase to another with measurable distinct resistivity. Specific materials that may be suitably used in phase change memory cells are alloys of elements of the VI group of the periodic table as Te or Se, also called chalcogenides or chalcogenic materials. Thus a thin film of chalcogenic material may be employed as a programmable resistor, switching between a high and a low resistance condition.

The use of chalcogenic storage elements has been already proposed to form a memory cell. To avoid disturbances caused by adjacent memory cells, the chalcogenic element is generally coupled with a selection element, generally a MOS transistor or a diode.

A possible organization of a PCM array is shown in FIG. 1. The memory array 1 of FIG. 1 comprises a plurality of memory cells 2, each including a storage element 3 of the phase change type and a selection element 4 formed as a bipolar PNP transistor. The same architecture may be however used for any array of storage elements that are selectively addressed through respective bipolar transistor selection elements.

The memory cells 2 are arranged on rows and columns. In each memory cell 2, the storage element 3 has a first terminal connected to an own bit line BLn−1, BLn, BLn+1, . . . , and a second terminal connected to an emitter of an own bipolar transistor 4; the bipolar transistor 4 has a base connected to an own control line, also called word line WLn−1, WLn, WLn+1, . . . and a grounded collector.

In order to address the storage element 3 belonging to a specific cell 2, for example the one connected to bit line BLn and to world line WLn, the bit line connected to the addressed cell (selected bit line BLn) is biased at a high voltage $V_{OP}$ and all the other (unselected) bit lines BLn−1, BLn+1, . . . are grounded. Furthermore, the word line connected to the addressed cell (selected word line WLn) is grounded and all the other (unselected) word lines WLn−1, WLn+1, . . . are biased at $V_{CC}$, so that the bipolar transistors 4 not connected to the selected word line are held off.

CMOS compatible processes for manufacturing PCM have been already proposed. For example, U.S. patent application Ser. No. 10/313,991, filed on Dec. 5, 2002 and entitled Small Area Contact Region, High Efficiency Phase Change Memory Cell and Fabrication Method Thereof, which is incorporated by reference herein in its entirety, describes a process providing a small area contact between the chalcogenic region and the resistive electrode. In this prior patent application, each cell is housed in an own active area. This prior application however does not deal with the optimization of the layout of the memory cell.

Since electronic devices are required to be more and more compact, it is desired to provide a highly compact layout for the array structure of FIG. 1.

BRIEF SUMMARY OF THE INVENTION

To increase the compactness of the array, according to one aspect of the invention, at least two cells are housed in a same active area of the device.

In particular, according to an embodiment, strips of active area are provided, each strip housing a plurality of emitter regions and base contact regions of a plurality of selection bipolar transistors, with the emitter regions and the base contact regions arranged alternately.

According to another embodiment, each active area has a rectangular shape and houses at least one base contact region and two emitter regions, so that at least two cells are arranged in the same active areas.

According to a further embodiment, strips of active area are provided, each strip housing a plurality of emitter regions and base contact regions of a plurality of selection bipolar transistors, at least two emitter regions being arranged between two subsequent base contact regions.

BRIEF DESCRIPTION OF THE SEVERAL VIEWS OF THE DRAWINGS

For the understanding of the present invention, preferred embodiments are now described, purely as non-limitative examples, with reference to the enclosed drawings, wherein.

DETAILED DESCRIPTION OF THE INVENTION

Figure 2:
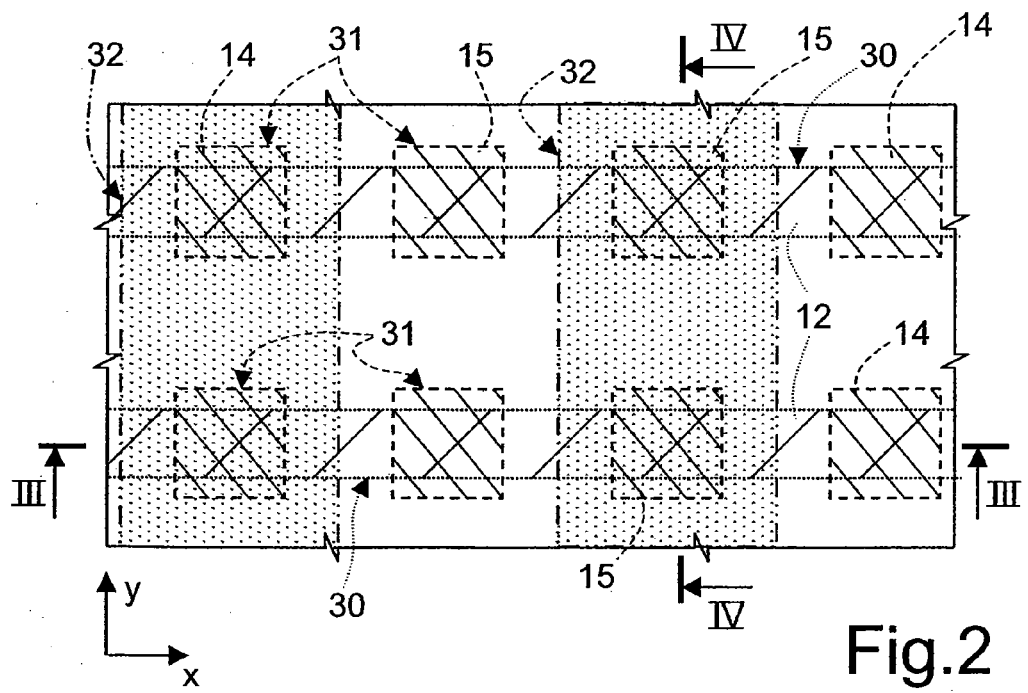
FIG. 2 shows the masks used for a cell array according to a first embodiment of the invention.
Figure 3:
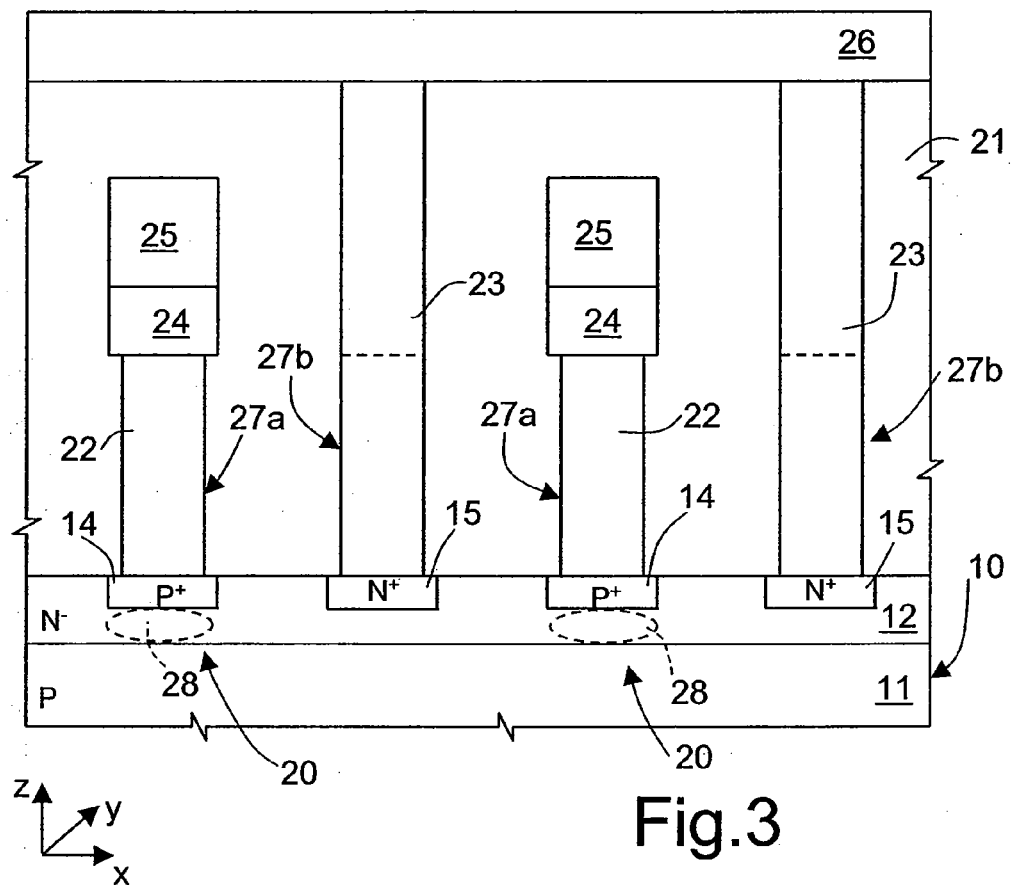
FIG. 3 shows a cross-section of the first embodiment, taken along line III-III of FIG. 2.
Figure 4:
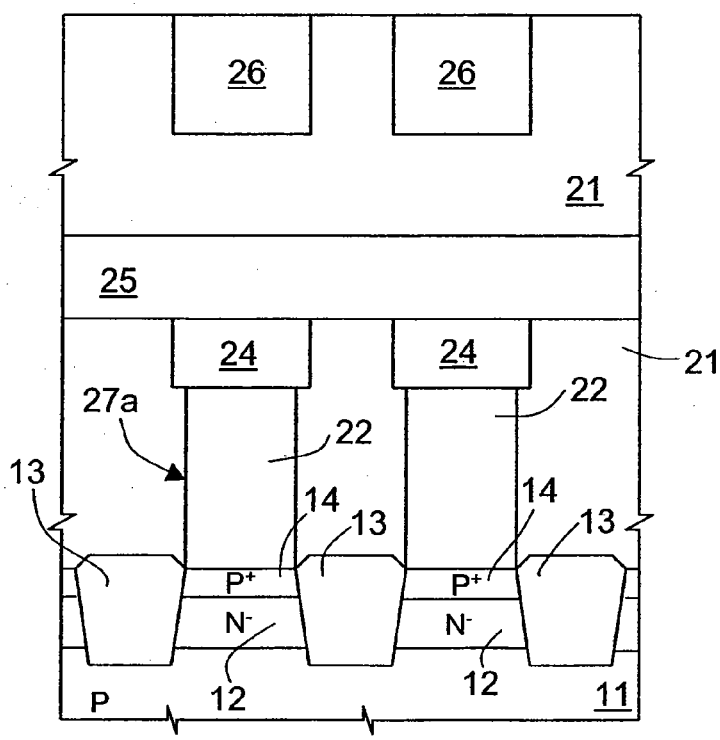
FIG. 4 shows a cross-section of the first embodiment, taken along line IV-IV of FIG. 2.

According to the embodiment of FIGS. 2-4, a memory array is formed in a body 10 of semiconductor material including a P-type common collector region 11. As visible in particular from FIG. 4, the body 10 houses a plurality of active area strips 12, of N-type, defining base regions. The active area strips 12 extend parallel to each other along a first direction (X-direction) and are electrically insulated from each other by field oxide regions 13 (FIG. 4).

Each active area strip 12 accommodates a plurality of emitter regions 14, of $P^+$-type, and plurality of base contact regions 15, of $N^+$-type, that are arranged alternately, that is each emitter region 14 is arranged between two base contact regions 15, and each base contact region 15 is arranged between two emitter regions 14. Thus, each pair of regions including an emitter region 14 and the adjacent base contact region 15 (for example, an emitter region 14 and the base contact region 15 arranged on right thereof), the active area strip 12 they are accommodated in, and the underlying collector region 11 form a selection transistor 20 of PNP-type, corresponding to bipolar transistor 4 of FIG. 1.

A dielectric region 21 extends on the body 10 and accommodates contacts, storage elements and interconnection lines.

The dielectric region 21 is generally formed by more layers deposited subsequently to allow forming the various regions therein and may also include different materials.

First and second contacts 22, 23 extend in first and second openings 27a, 27b of the dielectric region 21. Preferably, the first and second contacts 22, 23 are of tungsten, covered on the vertical and bottom sides with a barrier material (for example, Ti/TiN), not shown for simplicity.

Figure 1:
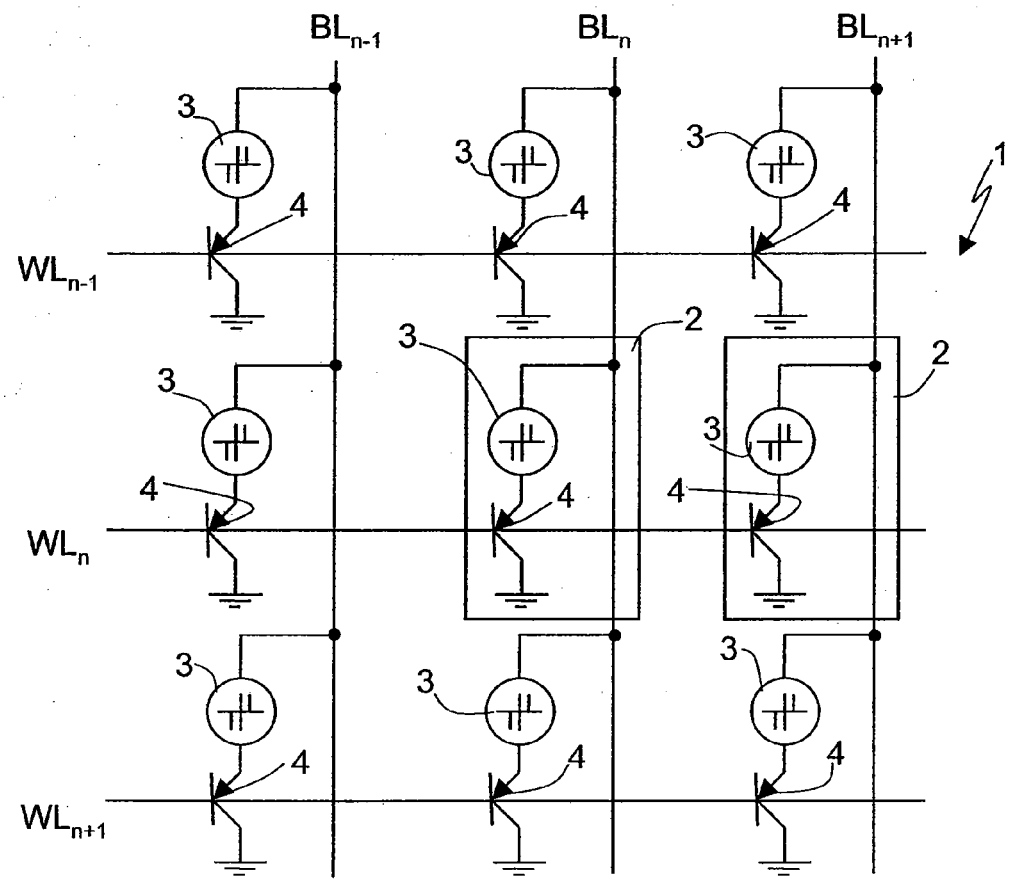
FIG. 1 is a circuit diagram of an array of cells including a storage element and a selection bipolar transistor.

The first contacts 22 extend each from an emitter region 14 to a chalcogenic storage element 24 forming the storage element 3 of FIG. 1. First metal lines 25, forming bit lines corresponding to bit lines BLn−1, BLn, BLn+1 of FIG. 1, extend along a second direction (Y-direction), thus transversely to the active area strips 12. Each first metal line 25 is in contact with the chalcogenic storage elements 24 that are aligned in the Y direction, as visible from the cross-section of FIG. 4. The first metal lines 25 are formed preferably in a first metal level.

The second contacts 23 are higher than the first contacts 22 and extend each from a base contact region 15 to second metal lines 26. The second metal lines 26, forming word lines corresponding to word lines WLn−1, WLn, WLn+1 of FIG. 1, extend along the first direction (X-direction), thus parallel to the active area strips 12 and perpendicular to the first metal lines 25. Each second metal line 25 is in contact with the second contacts 23 that are aligned in the X direction, as visible from the cross-section of FIG. 3. The second metal lines 26 are formed preferably in a second metal level.

FIG. 2 shows some masks to be used for manufacturing the memory array of FIGS. 3 and 4. In particular, FIG. 2 shows an active area mask 30, a contact mask 31 and an emitter mask 32.

The process for manufacturing the memory array of FIGS. 3 and 4 is the following.

Initially, the field oxide regions 13 are grown in the body 10, preferably including a substrate and an epitaxial layer of P type, using the active area mask 30 of FIG. 2, and thus defining the active area strips 12.

Then the active area strips 12 are implanted with N-type doping agents, thus forming the base regions of bipolar transistors. The body 10 is covered by a first layer of insulating material, forming the bottom portion of the dielectric region 21, and contacts are opened using contact mask 31, forming the first openings 27a and the bottom portion of the second openings 27b. Then, a boron implant (P+ emitter implant) is made, using emitter mask 32, so as to form emitter regions 14 below the first contacts 22. Thereafter, using an own mask not shown, that is the negative of the emitter mask 32, base contact regions 15 are implanted below the second contacts 23. In case, the base contact regions 15 may be doped before the emitter regions 14.

Then the first openings 27a and the bottom part of the second openings 27b are filled with a barrier layer, e.g., Ti/TiN, and with tungsten; then chalcogenic storage elements 24, the first metal lines 25, the second metal lines 26, the upper portion of the dielectric region 21 and the upper portion of the second contacts 23 are formed, e.g., as described in the before mentioned U.S. patent application Ser. No. 10/313, 991.

Alternatively, instead of the chalcogenic storage elements 24, other storage elements or other two or three-terminal elements that are compatible with standard CMOS back-end processes may be formed.

According to a different embodiment, a doped region 28 of N type, having a doping level close to that of the active area strips 12, is formed below each emitter region 14, as shown by broken lines in FIG. 3. In this case an N-type conductivity determining agent is implanted using the emitter mask 32, just after or just before the P+ emitter implant. Thereby, the base resistance and thus the emitter-to-base voltage drop are reduced, increasing also the immunity of the bipolar transistor against emitter-to-collector leakage and punch-through.

The embodiment of FIGS. 2-4 has the following advantages. First, the cell array has a very compact layout, thus reducing the overall dimensions of the device comprising the array. Furthermore, no active area corners are present inside the array, thus reducing to a minimum the stress due to isolation. There is also an intrinsic redundancy of the base contacts; the solution ensures both reduced defects and reduced intrinsic current leakage; thus the array has very good electronic properties.

Figure 5:
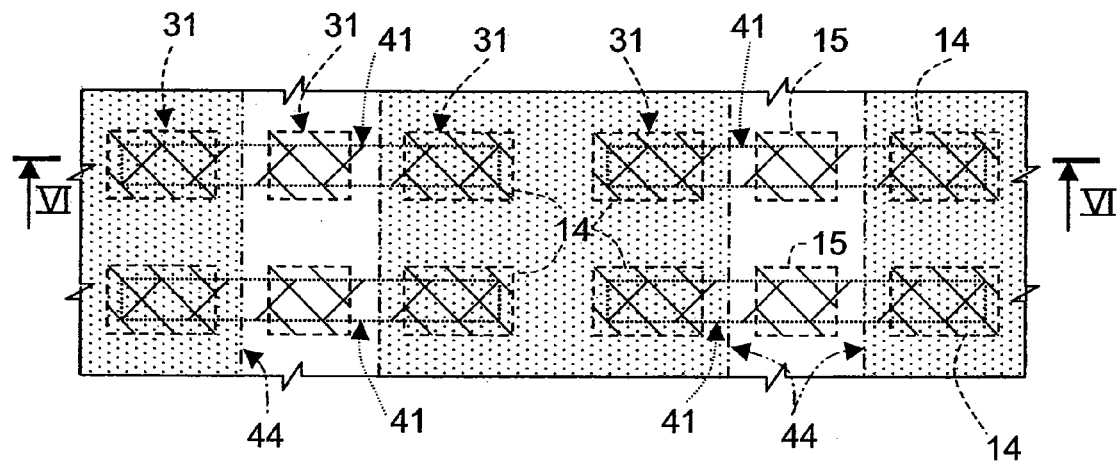
FIG. 5 shows the masks used for a cell array according to a second embodiment of the invention.
Figure 6:
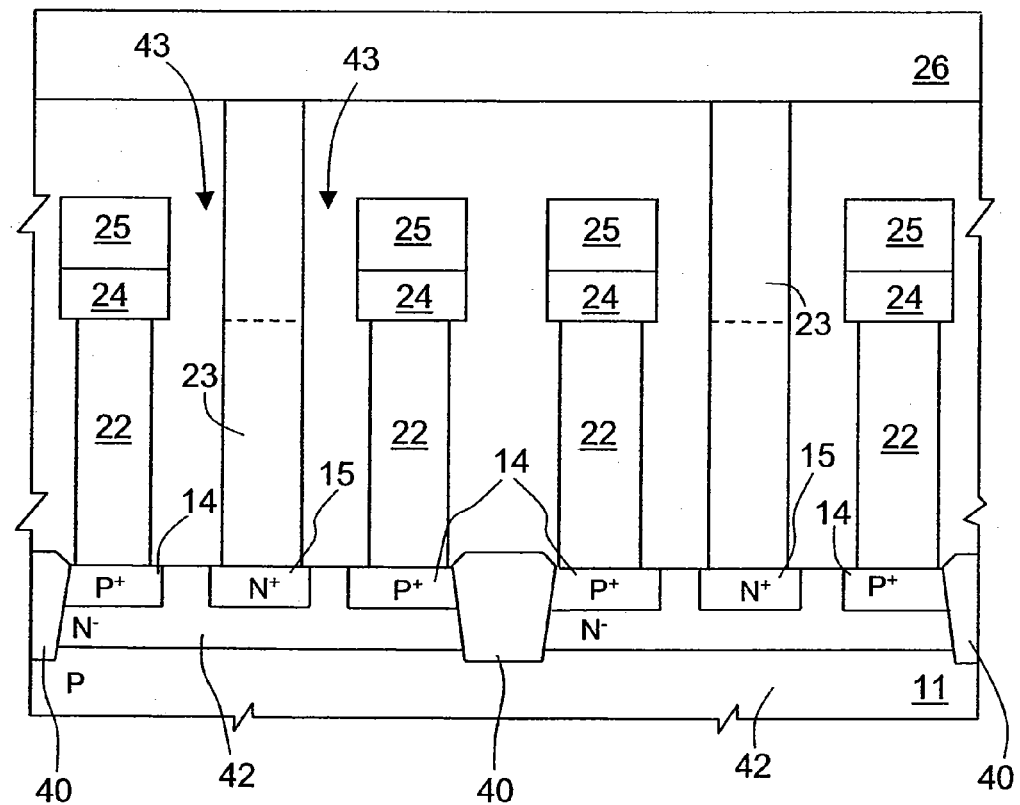
FIG. 6 is a cross-section of the second embodiment, taken along line VI-VI of FIG. 5.

FIGS. 5 and 6 show a different embodiment, wherein, in the X-direction, each emitter region 14 is separated by the adjacent emitter regions 14 by a base contact region 15 on one side (left in the drawings), and by a field oxide region 40 on the other side (right in the drawings). Here, the active area mask 41 (FIG. 5) has an grid-like pattern, and a field oxide region 40 having a grid-like shape, delimits a plurality of active regions 42 of rectangular shape. Each active region 42 accommodates only one base contact region 15 and two emitter regions 14, arranged on different sides of the base contact region 15 in the X-direction. Thus, each active region 42 accommodate two bipolar transistors 43 that share a same base contact region 15.

The cross-section in a plane perpendicular to that of FIG. 6 is the same as in FIG. 4.

As visible from FIG. 5, the shape of the active area mask 41 and of the emitter mask 44 differ from the active area mask 30 and the emitter mask 32 of FIG. 2; however, contact mask 31 is about the same as in FIG. 2.

The manufacturing process of the memory array of FIGS. 5 and 6 is the same described above with reference to FIGS. 2-4, with the only exception of the shape of the active area mask 41 and the emitter mask 44, as above outlined.

Also in the embodiment of FIGS. 5 and 6 a N-doped region 28 (not shown) may be provided below each emitter region 14, to reduce the base resistance.

With the embodiment of FIGS. 5 and 6, it is possible to save around 20% of silicon area with respect to the embodiment of FIGS. 2-4, even if the active area corners could introduce defectivity issues.

Figure 7:
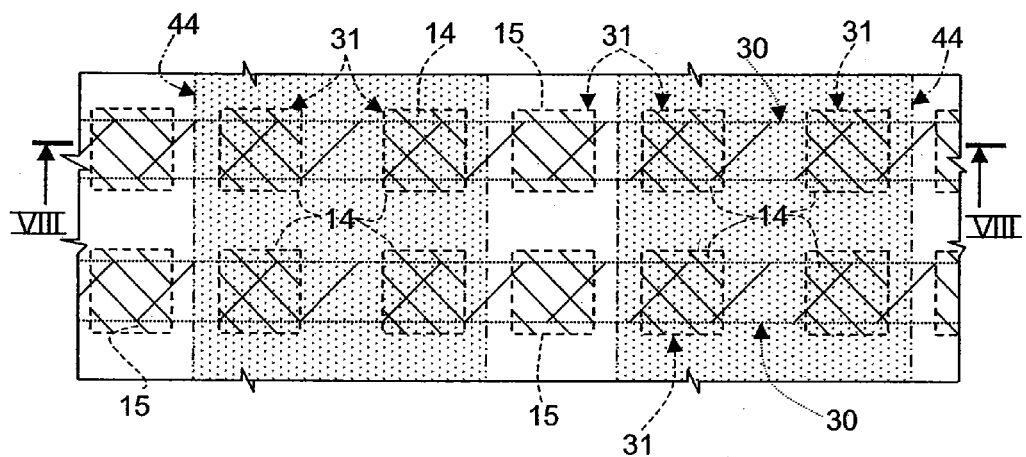
FIG. 7 shows the masks used for a cell array according to a third embodiment of the invention.
Figure 8:
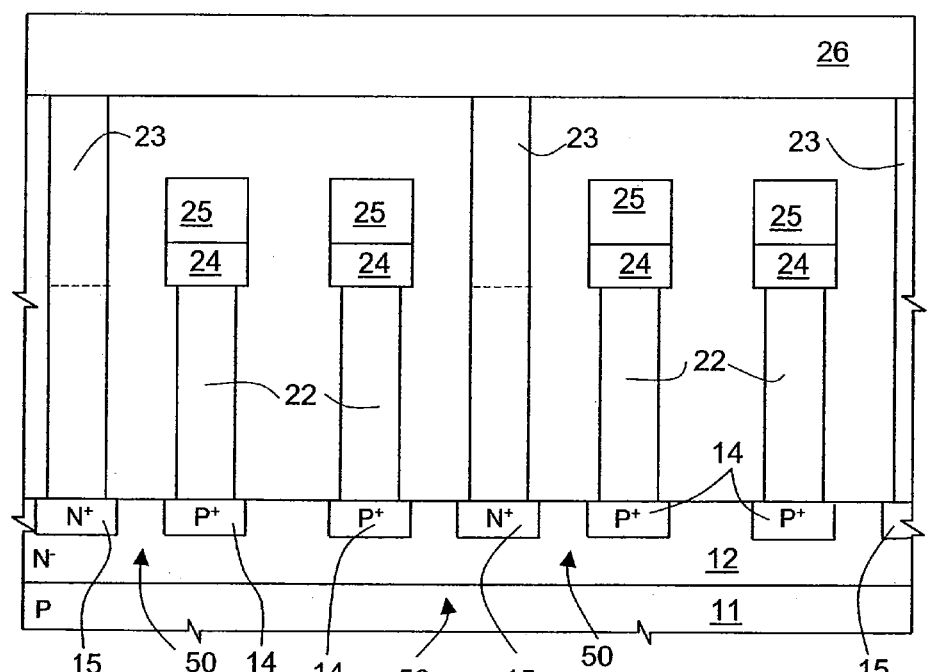
FIG. 8 is a cross-section of the third embodiment, taken along line VIII-VIII of FIG. 7.

FIGS. 7 and 8 show a third embodiment, wherein adjacent emitter regions 14 are not separated by other formations (base contacts or insulating material), but their electrical separation is only ensured by the intrinsic base region (active area strips 12).

Specifically, here the active areas are formed as active area strips 12, analogously to the embodiment of FIGS. 2-4, but each base contact 15 is formed every two emitter regions 14, analogously to the embodiment of FIGS. 5 and 6. Thus, each base contact region 15 forms two bipolar transistors 50 with the adjacent emitter regions 14.

The masks used to obtain the structure of FIG. 8 are shown in FIG. 7: as may be noted, the active area mask 30 is the same as in FIG. 2 and the emitter mask 44 is the same as in FIG. 5.

The manufacturing process of the memory array of FIGS. 7 and 8 is the same described above with reference to FIGS. 2-4, with the only exception of the shape of the emitter mask 44, as above outlined.

In the embodiment of FIGS. 7 and 8, it is possible to further reduce the area occupation, depending on the minimum distance attainable between two adjacent emitter regions 14; however, the presence of lateral parasitic PNP bipolar transistors (formed by two adjacent emitter regions 14 and the intermediate portion of the respective active area strip 12) renders this embodiment applicable only to solutions including design measure to reduce the resulting leakage current.

According to a different embodiment, more than two emitter regions 14, e.g., four, eight, etc., may be arranged between consecutive base contact regions 15 without an oxide or base isolation between them. In this case, the area occupation is still reduced, but the current leakage problem is worsened and base resistance could become a limiting factor for the emitters located farther from the base contact.

The advantages of the present invention are clear from the above.

Finally, it is clear that numerous variations and modifications may be made to the cell array as described and illustrated herein, all falling within the scope of the invention as defined in the attached claims.

E.g., it is possible to arrange multiple emitter regions 14 at each side of a base contact region 15 also in the embodiments of FIGS. 2-4 and 5-6, thus reducing the area occupation, while worsening current leakage due to parasitic components.

Furthermore, as indicated, the same array layout may be used for cells including a different storage component.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A process for manufacturing a cell array that includes a plurality of cells, each cell including a selection bipolar transistor and a corresponding storage component, each said bipolar transistor having a first, a second and a control region, and each said storage component having a first and a second terminal, said first region of each bipolar transistor being connected to said first terminal of the corresponding storage component, the process comprising:
    forming a common region of a first conductivity type in a body of semiconductor material;
    forming said second regions;
    forming a plurality of active area regions of a second conductivity type and a first doping level, overlying said common region and forming said control regions;
    forming a plurality of conduction regions of said first conductivity type in said active area regions and forming said first regions; and
    forming, in said active area regions, a plurality of control contact regions of said second conductivity type and a second doping level, higher than said first doping level, wherein each active area region is shared by at least two bipolar transistors.

2. A process according to claim 1 wherein said active area regions have a strip-like shape and each accommodate a plurality of the conduction regions and a plurality of the control contact regions.

3. A process according to claim 2 wherein said conduction regions and said control contact regions are alternated, and each conduction region is arranged between two consecutive control contact regions, and each control contact region is arranged between two consecutive conduction regions.

4. A process according to claim 2 wherein each control contact region has at least two consecutive conduction regions on each side.

5. A process according to claim 2, comprising forming a plurality of insulating regions having strip-like shape and extending each between two adjacent active area regions.

6. A process according to claim 1 wherein said active area regions have a rectangular shape and each accommodate at least two of the conduction regions and one of the control contact regions.

7. A process according to claim 6 wherein said one of the control contact regions is arranged between said at least two of the conduction regions.

8. A process according to claim 6, comprising forming an insulating region having a grid-like shape accommodating and defining said active area regions.

9. A process according to claim 8 wherein said active area regions have rectangular shape and are arranged according to a matrix.

10. A process according to claim 1, comprising:
    forming a dielectric region on top of said body; and
    forming a plurality of first and second electrical contact regions extending through said dielectric region, each said first contact region extending between and contacting a respective conduction region and the first terminal of a respective one of the storage elements, each said second contact region extending from and contacting a respective control contact region.

11. A process according to claim 10, comprising forming first and second pluralities of conductive lines in said dielectric region, the conductive lines of said first plurality extending on top of said cells parallel to each other along a second direction, the conductive lines of said second plurality extending on top of said first plurality, parallel to each other along a first direction transverse to said second direction, the conductive lines belonging to one of said first and second plurality of conductive lines being in contact with said second terminals of said storage components and the conductive lines belonging to another one of said first and second plurality of conductive lines being in contact with said second contact regions.

12. A process according to claim 1 wherein each storage component is a phase change memory element of chalcogenic material.

13. A process according to claim 1 wherein said first region is an emitter region, said second region is a collector region and said control region is a base region.

14. A process according to claim 1, comprising forming enriched regions having said second conductivity type and a third doping level higher than said first doping level, said enriched regions extending in said active area regions and being located each below the conduction region of a respective bipolar transistor.

15. A process for manufacturing a cell array, comprising the steps of:
    providing a body of semiconductor material of a first conductivity type;
    forming a plurality of active area regions of a second conductivity type and a first doping level;
    forming, in each active area region, a control contact region of said second conductivity type and a second doping level, higher than said first doping level;
    forming, in each active area region, at least two conduction regions of said first conductivity type, each said conduction region forming, together with said active area region and said body, a selection bipolar transistor; and
    forming, on top of said body, a plurality of storage components, each storage component having a terminal connected to a respective conduction region and defining, together with said bipolar transistor, a cell of said cell array.

16. The process according to claim 15 wherein said step of forming a plurality of active area regions comprises:

growing insulating regions on said body, said insulating regions surrounding said active area regions; and implanting said active area regions with doping agents of said second conductivity type.

17. A process according to claim 16 wherein said insulating regions and said active area regions have strip-like shape.

18. A process according to claim 16 wherein said insulating regions form a grid-like structure and said active area regions have a rectangular shape.

19. A process according to claim 16 wherein the conduction regions are formed by implanting dopants of the first conductivity type through a mask, the process further comprising implanting dopants of the second conductivity type through the mask, thereby forming respective enriched regions below the conduction regions and in the active area regions.

20. A process of manufacturing a memory device, comprising forming a plurality of storage components of a plurality of memory cells;

forming a semiconductor body of a first conductivity type, the semiconductor body forming a first conduction region of a plurality of selection bipolar transistors of the memory cells, each of the memory cells including one of the storage components and a corresponding one of the bipolar transistors;

forming a plurality of active area regions of a second conductivity type, overlying the semiconductor body and forming respective base regions of the bipolar transistors;

forming, in the active area regions, a plurality of conduction regions of the first conductivity type, the conduction regions forming second conductive regions of the bipolar transistors, respectively; and forming, in the active area regions, a plurality of control contact regions of the second conductivity type and a doping level that is higher than a doping level of the active area regions, wherein each active area region includes one of the control contact regions and consecutive first and second conduction regions of the plurality of conduction regions positioned on opposite sides of the one of the control contact regions.

21. The process of claim 20 wherein the conduction regions and the control contact regions are alternated, and each conduction region is arranged between two consecutive control contact regions, and each control contact region is arranged between two consecutive conduction regions.

22. The process of claim 20 wherein each control contact region has opposite sides and the conduction regions include at least two consecutive conduction regions on each of the opposite sides of the control contact region.

23. The process of claim 20 wherein the active area regions each have a rectangular shape and each accommodate at least two of the conduction regions and one of the control contact regions.

24. The process of claim 20 wherein the memory cells form a memory array that includes rows and columns, each row including a set of the plurality of active area regions, the process further comprising forming an insulating region separating the rows from each other and separating the active area regions within each row from one another.

25. The process of claim 20 wherein each storage component is a phase change memory element.

26. The process of claim 20, further comprising forming enriched regions having the second conductivity type and a doping level higher than the doping level of the active area regions, the enriched regions extending in said active area regions and being located each below the conduction region of a respective one of the bipolar transistors.

* * * * *